United States Patent [19]

Nishioka et al.

[11] Patent Number: 4,539,491
[45] Date of Patent: Sep. 3, 1985

[54] VOLTAGE/CURRENT CONVERSION CIRCUIT

[75] Inventors: Akira Nishioka; Yoshihiro Kawanabe; Hiroyuki Takahori; Hideki Fujimoto, all of Tokyo, Japan

[73] Assignee: Pioneer Electronic Corporation, Tokyo, Japan

[21] Appl. No.: 399,048

[22] Filed: Jul. 16, 1982

[30] Foreign Application Priority Data

Jul. 20, 1981 [JP] Japan .................. 56-114129

[51] Int. Cl.³ .................. H03K 3/01; H03F 3/68
[52] U.S. Cl. .................. 307/297; 307/494; 307/270; 307/261; 307/362; 330/293; 330/260
[58] Field of Search .................. 307/270, 296 R, 297, 307/261, 351, 265; 328/132; 330/293, 260, 257

[56] References Cited

U.S. PATENT DOCUMENTS

| | | | |
|---|---|---|---|
| 3,689,848 | 9/1972 | Geffe et al. | 330/260 |
| 3,694,748 | 9/1972 | Hekimian | 307/351 |
| 3,866,063 | 2/1975 | Long | 330/257 |
| 3,991,323 | 11/1976 | Preybylski | 307/265 |
| 4,087,758 | 5/1978 | Hareyama | 330/260 |
| 4,145,649 | 4/1979 | Pickton | 307/264 |
| 4,213,081 | 7/1980 | Taylor | 328/132 |
| 4,251,743 | 2/1981 | Hareyama | 307/297 |
| 4,274,016 | 6/1981 | Ghahramami | 307/270 |
| 4,338,527 | 7/1982 | Nagano | 330/257 |
| 4,354,163 | 10/1982 | Kato | 330/293 |
| 4,408,129 | 10/1983 | Arnold et al. | 307/270 |

OTHER PUBLICATIONS

Sessions, IC Schematic Source Master, Wiley & Sons, New York, 1978, pp. 42 & 47.

Primary Examiner—Stanley D. Miller
Assistant Examiner—Timothy P. Callahan
Attorney, Agent, or Firm—Sughrue, Mion, Zinn, Macpeak, and Seas

[57] ABSTRACT

A voltage/current conversion circuit giving an output current which is proportional to an input voltage. The circuit includes an operational amplifier to one input of which the input voltage is applied, first and second transistors, to the commonly connected bases of which the output of the operational amplifier is applied, and a feed-back path connecting the collector of the first transistor to the other input of the operational amplifier. With the circuit thus constructed, the output derived from the collector of the second transistor is in proportion to the input voltage.

3 Claims, 3 Drawing Figures

VOLTAGE/CURRENT CONVERSION CIRCUIT

BACKGROUND OF THE INVENTION

The present invention relates to a voltage/current conversion circuit in which an output current is taken out which is proportional to an input voltage.

Shown in FIG. 1 is a prior art voltage/current conversion circuit in which an input voltage $V_i$ is applied to a non-inverting input terminal of an operational amplifier 11 and the output of the latter is applied to the base of a transistor $Q_1$ constituting a current converting stage. The emitter of the transistor $Q_1$ is connected both to a power supply $V_{cc}$ through a resistor $R_1$ and to the inverting input terminal of the operational amplifier 11. The collector of the transistor $Q_1$ is connected to the collector connected as a transistor $Q_2$ of a diode. The transistor $Q_2$, together with a transistor $Q_3$ having a base commonly connected to the base of the transistor $Q_2$, and emitter resistors $R_2$ and $R_3$ of the transistors $Q_2$ and $Q_3$, respectively, constitutes a current mirror circuit 12.

With such a circuit arrangement where a PNP transistor ($Q_1$) is employed in the current converting stage, it is a usual practice to use a lateral PNP transistor due to the fact that a monolithic IC is relatively simple to fabricate in a IC manufacturing process. The lateral PNP is, however, disadvantageous in that transition frequency $f_T$ is low and is degraded in linearity of the current amplification factor $h_{FE}$ in a large current flow region, resulting that a preferrable characteristic has not been obtained.

Although the foregoing disadvantage can be resolved if a vertical PNP transistor is employed, it is disadvantageous in another aspects such that the IC manufacturing process becomes complicated involving a number of manufacturing steps, and therefore the cost for manufacturing the same becomes expensive.

SUMMARY OF THE INVENTION

Accordingly, an object of this invention is to provide a voltage/current conversion circuit giving an output current linearly proportional to an input voltage, which circuit is easy to fabricate in forming an IC.

In accordance with the invention, the foregoing and other objects are accomplished by applying an output of an operational amplifier, to one input of which a predetermined input voltage is applied, to bases of first and second transistors, each of the transistors having an emitter resistor, and feeding back the collector output of the first transistor to the other input of the operational amplifier, wherein the output current is taken out from the collector of the second transistor.

DETAILED DESCRIPTION OF THE PREFERRED EMBODIMENT

Figure 1:
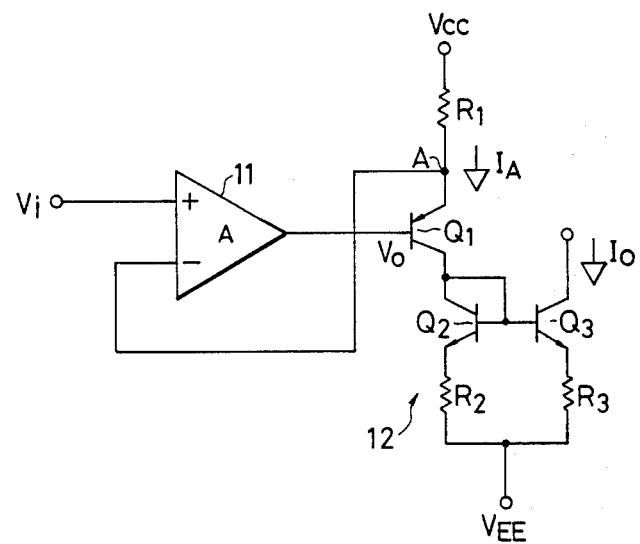
FIG. 1 is a circuit diagram illustrating a prior art voltage/current conversion circuit.
Figure 2:
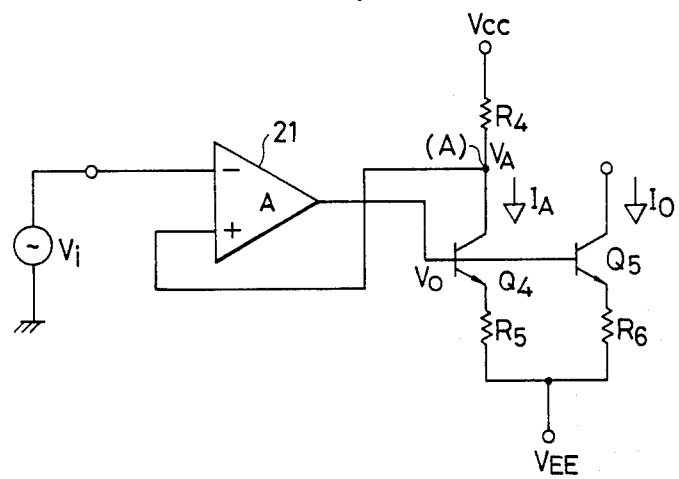
FIG. 2 is a circuit diagram illustrating a preferred embodiment of a voltage/current conversion circuit according to the invention.

A preferred embodiment according to the invention will now be described with reference to the accompanying drawings. FIG. 2 is a circuit diagram showing one preferred embodiment according to the invention, in which a predetermined input voltage $V_i$ is applied to a non-inverting input terminal of an operational amplifier 21. To an output terminal of the operational amplifier 21, bases of first and second transistors $Q_4$ and $Q_5$ are commonly connected. The collector of the transistor $Q_4$ is connected both to a power supply $V_{cc}$ through a resistor $R_4$ and to a non-inverting input terminal of the operational amplifier 21 to thereby form a negative feedback loop. The respective emitters of the transistors $Q_4$ and $Q_5$ are connected to another power supply $V_{EE}$ through emitter resistors $R_5$ and $R_6$, respectively. With the circuit thus arranged, an output current $I_O$ is derived from the collector of the transistor $Q_5$. The voltage $V_A$ at point A is set to be in phase with the input voltage $V_i$, and it is assumed that the transistors $Q_4$ and $Q_5$ have equivalent characteristics and the resistance values of the resistors $R_5$ and $R_6$ are equal to each other.

With such a circuit arrangement, the collector current $I_A$ of the transistor $Q_4$ must comply with the following condition in order that the voltage $V_A$ at point A can be equal to the input voltage $V_i$.

$$I_A = (V_{cc} - V_i)/R_4 \tag{1}$$

Here, provided that the current amplification factor $h_{FE}$ of the transistor $Q_4$ is large and the linearity of $h_{FE}$ with respect to the variation in current is good, the emitter current $I_E$ of the transistor $Q_4$ becomes equal to $I_A$.

Furthermore, since the transistors $Q_4$ and $Q_5$ have equivalent characteristics and $R_5$ is equal to $R_6$, the collector current $I_O$ of the transistor $Q_5$ is expressed as follows:

$$I_O = I_A = (V_{cc} - V_i)/R_4 \tag{2}$$

As is apparent from equation (2), it is possible to derive the output current $I_O$ which is in proportional to the input voltage $V_i$ from the collector of the transistor $Q_5$.

Figure 3:
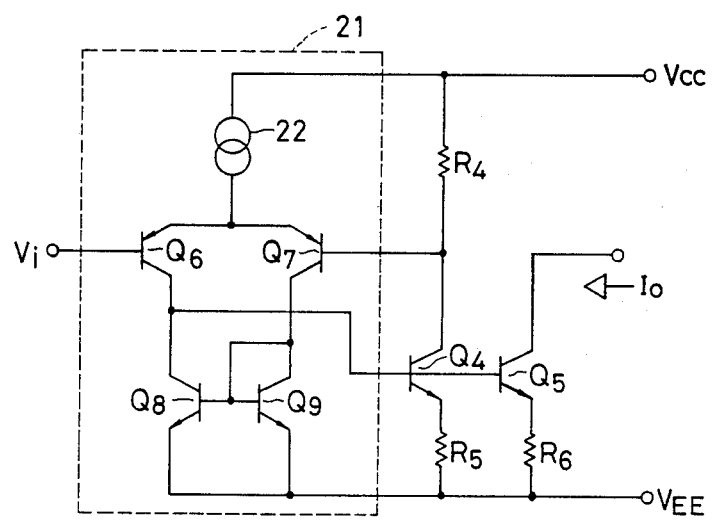
FIG. 3 is a specific circuit diagram of the embodiment shown in FIG. 2.

A specific circuit diagram of the embodiment shown in FIG. 2 is shown in FIG. 3. The operational amplifier 21 includes transistors $Q_6$ and $Q_7$, the emitters of which are commonly connected so as to effect differential operations. A constant current source 22 is connected to the common juncture point of the aforementioned transistors. Transistors $Q_8$ and $Q_9$ constituting a current mirror circuit in which the collectors of the transistors $Q_6$ and $Q_7$ are commonly connected to the collectors of the transistors $Q_8$ and $Q_9$, respectively, and the bases of the transistors $Q_8$ and $Q_9$ are commonly connected to each other. The base of the transistor $Q_7$ is connected to the collector of the transistor $Q_4$. The input voltage $V_i$ is applied to the base of the transistor $Q_6$ and the output current is derived from the collector of the transistor $Q_5$.

As described, in accordance with the invention, neither lateral PNP transistors nor vertical PNP transistors are employed, the former being low in transition frequency $f_T$ and undesirable in linearity of current amplification factor $h_{FE}$ in the large current flowing region, and the latter being complicated in forming with an IC.

Accordingly, the output current which is linear or in proportional to the input voltage is obtainable and furthermore the IC formation can be easily performed according to this invention.

The voltage/current conversion circuits according in the invention is usable to a VCA voltage/current conversion circuit, FM multiplex multiplier circuits, or the like.

What is claimed is:

1. A voltage/current conversion circuit comprising:
    an operational amplifier having first and second input terminals;
    a first NPN transistor having an emitter connected through a first emitter resistor to a first power supply, a base connected to an output terminal of said operational amplifier, and a collector connected through a resistor to a second power supply;
    a second NPN transistor having an emitter connected through a second emitter resistor, to said first power supply, a base commonly connected to the base of said first transistor, and a collector, the ends of said first and second emitter resistors away from said transistors being connected together;
    a negative feed-back loop for feeding back a collector output of said first transistor to the first input of said operational amplifier;
    means for applying a predetermined input voltage to the second input terminal of said operational amplifier;
    a lead connected to the collector of said second transistor for deriving an output current therefrom; and
    wherein said output current is proportional to said input voltage.

2. The circuit as claimed in claim 1 wherein said first and said second transistors are of equivalent characteristics.

3. The circuit as claimed in claim 1 or 2 wherein the collector voltage of said first transistor is equal to the predetermined input voltage.

* * * * *